(12) United States Patent
Kuenemund et al.

(10) Patent No.: US 10,276,222 B2
(45) Date of Patent: Apr. 30, 2019

(54) METHOD FOR ACCESSING A MEMORY AND MEMORY ACCESS CIRCUIT

(71) Applicant: Infineon Technologies AG, Neubiberg (DE)

(72) Inventors: Thomas Kuenemund, Munich (DE); Gerd Dirscherl, Munich (DE); Gunther Fenzl, Hoehenkirchen (DE); Joel Hatsch, Holzkirchen (DE); Nikolai Sefzik, Markt Schwaben (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/710,617

(22) Filed: May 13, 2015

(65) Prior Publication Data

US 2015/0332756 A1 Nov. 19, 2015

(30) Foreign Application Priority Data

May 16, 2014 (DE) ........................ 10 2014 106 909

(51) Int. Cl.
| | | |
|---|---|---|
| *G11C 7/12* | (2006.01) | |
| *G11C 11/419* | (2006.01) | |
| *G11C 7/10* | (2006.01) | |
| *G11C 8/06* | (2006.01) | |
| *G11C 8/18* | (2006.01) | |
| *G11C 11/408* | (2006.01) | |
| *G11C 11/415* | (2006.01) | |

(52) U.S. Cl.
CPC ............ *G11C 7/12* (2013.01); *G11C 7/106* (2013.01); *G11C 7/1012* (2013.01); *G11C 7/1039* (2013.01); *G11C 7/1066* (2013.01); *G11C 7/1087* (2013.01); *G11C 7/1093* (2013.01); *G11C 8/06* (2013.01); *G11C 8/18* (2013.01); *G11C 11/4087* (2013.01); *G11C 11/415* (2013.01); *G11C 11/419* (2013.01)

(58) Field of Classification Search
CPC ...... G11C 11/419; G11C 11/41; G11C 11/416
USPC ................................ 365/154, 189.2, 189.04
See application file for complete search history.

(56) References Cited

U.S. PATENT DOCUMENTS

| | | | | |
|---|---|---|---|---|
| 4,939,002 A | * | 6/1990 | Houston | ................ G11C 13/00 365/241 |
| 5,590,087 A | * | 12/1996 | Chung | ..................... G11C 8/16 365/177 |
| 6,556,482 B2 | * | 4/2003 | Shimoyama | ............. G11C 7/22 365/189.04 |
| 6,862,242 B2 | | 3/2005 | Chen | |
| 8,351,287 B1 | * | 1/2013 | Sood | ..................... G11C 11/412 326/38 |
| 2001/0024382 A1 | * | 9/2001 | Shimoyama | ............. G11C 7/22 365/189.011 |

(Continued)

*Primary Examiner* — Alexander Sofocleous
*Assistant Examiner* — Alfredo Bermudez Lozada
(74) *Attorney, Agent, or Firm* — Viering, Jentschura & Partner mbB

(57) ABSTRACT

In accordance with one embodiment, a method for accessing a memory is provided, including carrying out a first access to the memory and charging, for a memory cell, a bit line coupled to the memory cell to a value which is stored or to be stored in the memory cell, holding the state of the bit line until a second access, which follows the first access, and outputting the held state if the second access is a read access to the memory cell.

16 Claims, 9 Drawing Sheets

(56) References Cited

U.S. PATENT DOCUMENTS

| | | | |
|---|---|---|---|
| 2004/0079968 A1* | 4/2004 | Takahashi | G11C 11/405 |
| | | | 257/200 |
| 2005/0024928 A1* | 2/2005 | Cummings | G11C 11/413 |
| | | | 365/154 |
| 2009/0161442 A1* | 6/2009 | New | G11C 7/08 |
| | | | 365/189.04 |
| 2009/0296500 A1 | 12/2009 | Murata | |

\* cited by examiner

US 10,276,222 B2

METHOD FOR ACCESSING A MEMORY AND MEMORY ACCESS CIRCUIT

CROSS-REFERENCE TO RELATED APPLICATION

This application claims priority to German Patent Application Serial No. 10 2014 106 909.9, which was filed May 16, 2014, and is incorporated herein by reference in its entirety.

TECHNICAL FIELD

Various embodiments relate generally to methods for accessing a memory and memory access circuits.

BACKGROUND

SRAM memories, such as are used in control chips, for example, are typically intended to have a high access speed and a low energy consumption. Accordingly, mechanisms are desirable which allow a high access speed, without the energy consumption being increased in this case.

SUMMARY

In accordance with one embodiment, a method for accessing a memory is provided, including carrying out a first access to the memory and charging, for a memory cell, a bit line coupled to the memory cell to a value which is stored or to be stored in the memory cell, holding the state of the bit line until a second access, which follows the first access, and outputting the held state if the second access is a read access to the memory cell.

In accordance with a further embodiment, a memory access circuit in accordance with the method for accessing a memory is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. Other embodiments are also possible and the embodiments can be modified from structural, logical and electrical standpoints, without departing from the subject matter of the invention. The different embodiments are not necessarily mutually exclusive, rather different embodiments can be combined with one another, thereby giving rise to new embodiments. In the context of this description, the terms "connected" and "coupled" are used to describe a direct or indirect connection and a direct or indirect coupling.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

For control chips having a low energy consumption, use is typically made of SRAM (Static Random Access Memory) memories on the chip for storing program code and data.

Figure 1:
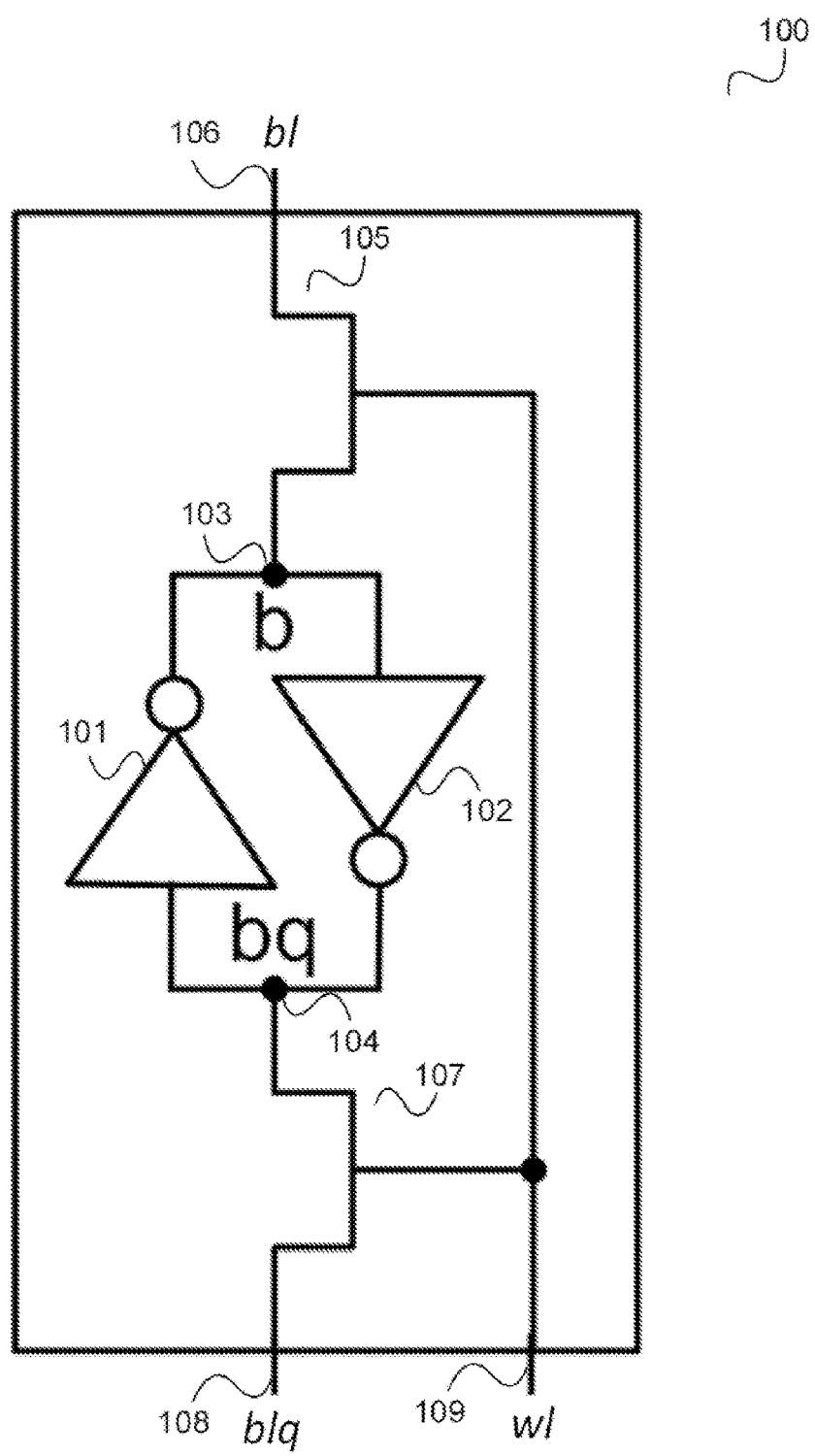
FIG. 1 shows an SRAM cell.

FIG. 1 shows an SRAM cell 100.

The SRAM cell 100 includes a first inverter 101 and a second inverter 102.

The output of the first inverter 101 is coupled to the input of the second inverter 102 by a first node 103, which is designated by b.

The output of the second inverter 102 is coupled to the input of the first inverter 101 by a second node 104, which is designated by bq.

The first node 103 is coupled to a first bit line 106 by a first field effect transistor (FET) 105.

The second node 104 is coupled to a second bit line 108 by a second field effect transistor (FET) 107.

The gates of the FETs 105, 107 are coupled to a word line 109.

The state (i.e. the level) at the first node 103 is the state of the SRAM cell and corresponds to the value of the bit which is stored by the SRAM cell 100. The state at the second node 104 is the inverse of the state at the first node 103. Correspondingly, the first bit line 106 and the second bit line 108 are also designated as bit line and inverse bit line.

Using the word line 109, the SRAM cell 100 can be activated for an access. Depending on whether a read access or a write access is involved, the state of the SRAM cell 100 is read out or defined (i.e. written) by the bit lines 106, 108.

An SRAM memory includes a multiplicity of SRAM cells in the form of an SRAM cell array. In order to save energy and chip area, a precharge/discharge mechanism can be used instead of the use of a sense amplifier for a read access. In this case, by way of example, the bit lines 106, 108 are precharged and in the event of a read access to the SRAM cell 100, depending on the state of the SRAM cell 100, are respectively discharged or not discharged (wherein the state of the bit lines 106, 108 is complementary after each access).

The state read out or the inverted state read out can be held in a bit line latch respectively provided for the bit line 106 and the inverted bit line 108, until the next read access.

In this case, each access by a processor requires an access to the SRAM memory cell array, which requires a corresponding precharge. This consumes energy and can also reduce the processing speed of the processor on account of wait cycles that are inserted at relatively high processor clock frequencies.

In order to avoid speed losses, a cache with corresponding cache control may be provided. The speed may be increased by this measure, but it requires additional chip area and increases the energy consumption. Moreover, cases can occur such as e.g. that, in the event of a data transfer of requested data between the main memory (i.e. the SRAM memory) and the cache which requires a plurality of cycles, the memory bus is blocked for some other processor access to memory (such as a nonvolatile memory, e.g. a flash or a ROM) or peripheral components connected to the bus.

A description is given below of embodiments in which an increased access speed to a memory, e.g. an SRAM, can be achieved, wherein at the same time the energy consumption can be reduced.

Figure 2:
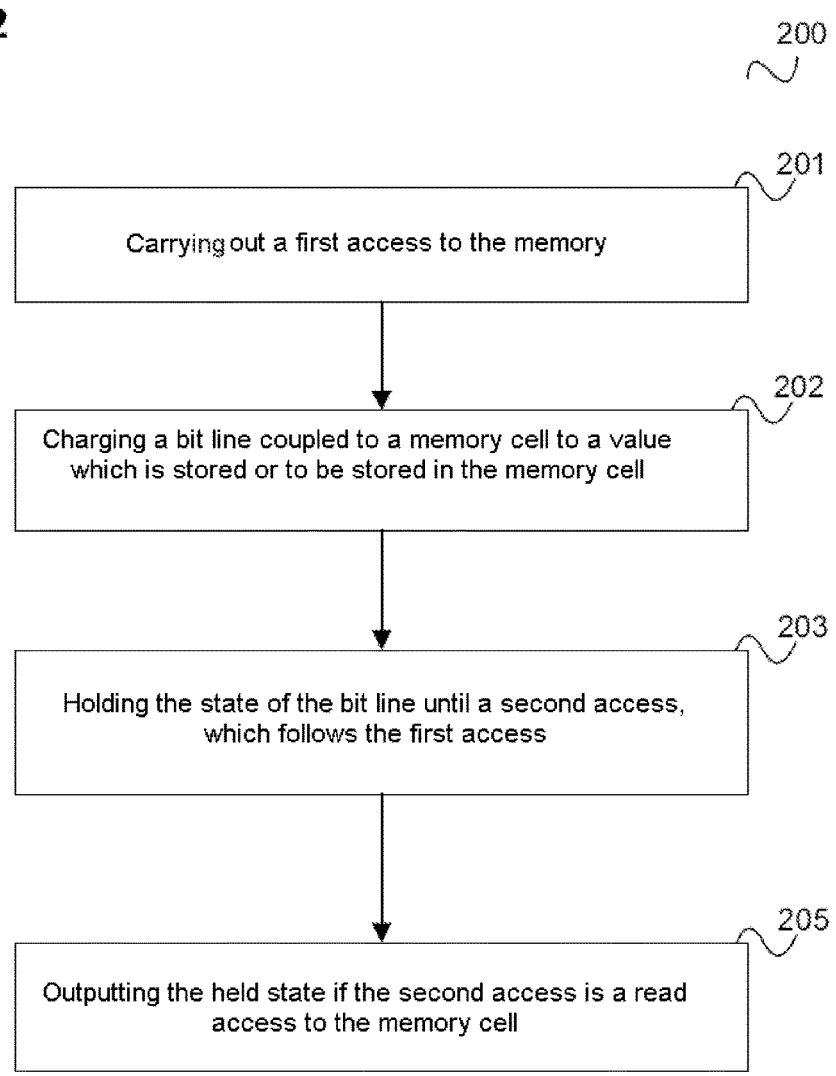
FIG. 2 shows a flow chart in accordance with one embodiment.

FIG. 2 shows a flow chart 200 in accordance with one embodiment.

The flow chart 200 illustrates a method for accessing a memory.

In 201, a first access to the memory is carried out.

In 202, for example while the access is being carried out, for a memory cell, a bit line coupled to the memory cell is charged to a value which is stored or to be stored in the memory cell.

In 203, the state of the bit line is held until a second access, which follows the first access.

In 204, the held state is output if the second access is a read access to the memory cell.

In other words, the state of a bit line which the bit line obtained as a result of read-out of a memory cell is held for a possible subsequent read access to the memory cell. Illustratively, buffer storage (i.e. caching) is already effected at the bit line level, instead of in a cache memory connected downstream of the memory. Correspondingly, a circuit or a circuit arrangement for carrying out the method illustrated in FIG. 2 is also designated hereinafter as nanocache.

The nanocache can be used for example as a mechanism for increasing the processing speed and reducing the energy consumption in the case of a system-on-chip (SoC) architecture, which has low system costs, i.e. requires a small chip area. Additional chip area such as for cache memories with corresponding chip controllers is not necessary.

The second access is for example that access to the memory which directly follows the first access, that is to say that between the first access and the second access for example no access to the memory takes place (or at least no access in which the bit line is involved, i.e. in which the value of the bit line is changed, processed or output).

The first access is for example reading a value from the memory cell or a memory cell coupled to the same word line.

The first access can also be writing a value to the memory cell or a memory cell coupled to the same word line.

In accordance with one embodiment, the method, if the second access is a write access to the memory cell, includes charging the bit line to a value which is to be written during the write access.

In accordance with one embodiment, the method, if the second access is a read access to a different memory cell coupled to the bit line, includes precharging the bit line.

The method includes for example holding the state by a latch.

In accordance with one embodiment, the method includes charging, for each further memory cell of a plurality of further memory cells coupled to the same word line as the memory cell, a further bit line coupled to the further memory cell to a value which is stored or to be stored in the further memory cell, holding the states of the further bit lines until the second access, and selecting the held state of the memory cell accessed by the second access from the held states and outputting the selected state if the second access is a read access to the memory cell or one of the further memory cells.

Selecting and outputting the selected state include for example multiplexing the held states in accordance with the memory cell accessed by the second access.

The memory cell is an SRAM cell, for example.

The method includes for example checking whether the second access is a read access to the memory cell.

In accordance with one embodiment, the method includes checking whether the second access is an access to the memory cell or a memory cell coupled to the same word line.

By way of example, checking whether the second access is an access to the memory cell or a memory cell coupled to the same word line includes comparing a word line address of the first access with a word line address of the second access.

Figure 3:
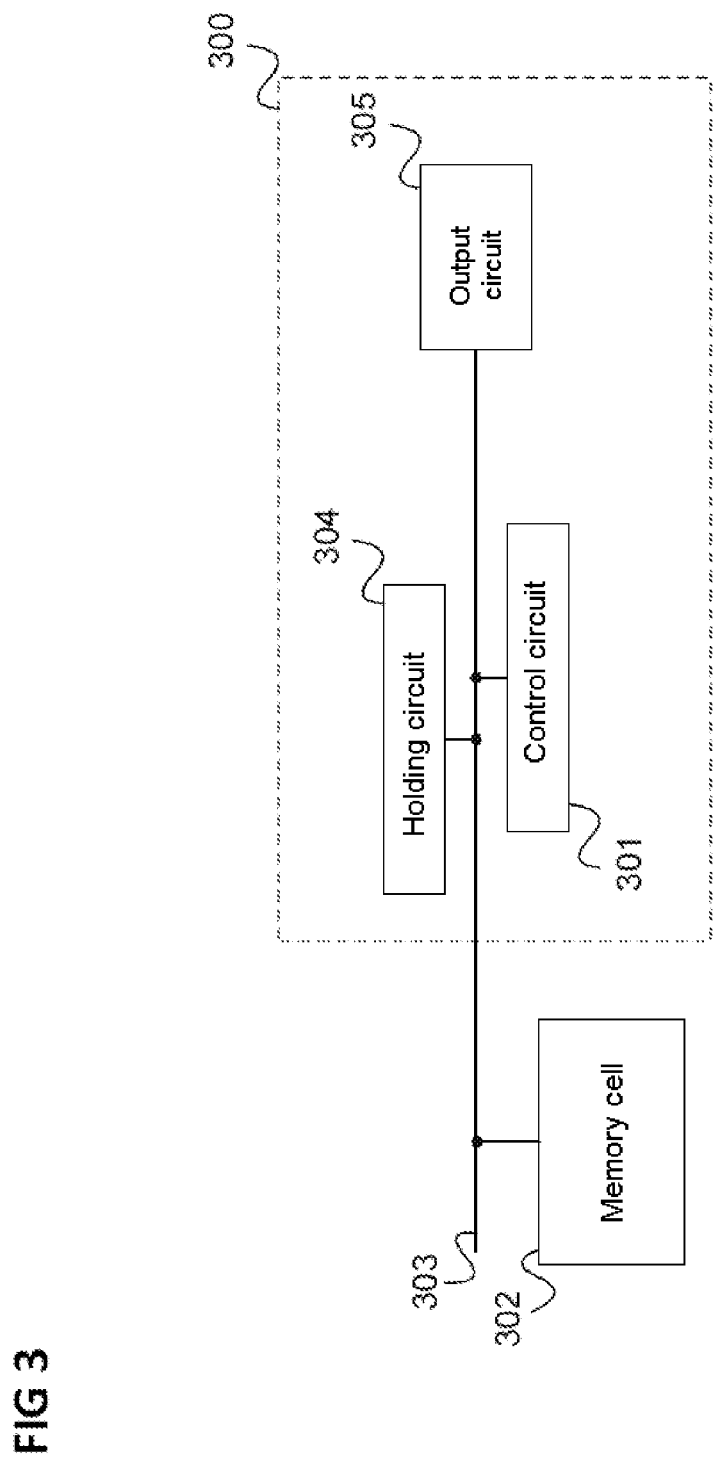
FIG. 3 shows a memory access circuit in accordance with one embodiment.

The method is carried out for example by a circuit such as is illustrated in FIG. 3.

FIG. 3 shows a memory access circuit 300 in accordance with one embodiment.

The memory access circuit 300 includes a bit line control circuit 301 designed, in the event of a first access to a memory being carried out for a memory cell 302 of the memory, to charge a bit line 303 coupled to the memory cell to a value which is stored or to be stored in the memory cell.

The memory access circuit 300 furthermore includes a holding circuit 304 designed to hold the state of the bit line 303 until a second access, which follows the first access.

The memory access circuit 300 additionally includes an output circuit 305 designed to output the held state if the second access is a read access to the memory cell 302.

It should be noted that embodiments described in association with the method illustrated in FIG. 2 analogously hold true for the memory access circuit 300, and vice versa.

Various embodiments are described in greater detail below.

In accordance with one embodiment, each RAM basic block (e.g. 4 Kbytes) is equipped in each case with the nanocache functionality, that is to say that the state of the bit line which is used for reading out the RAM basic block is held for each RAM basic block. In other words, in this case, the nanocache can be regarded as a single-row cache per RAM basic block. For an access in which a word line is activated, the states of all the memory cells connected to the word line are stored.

The states are held in bit line latches, for example. Correspondingly, accesses to the states are possible without a precharge operation. The stored states can be accessed for example with different granularities, for example in bytes, half-words or words.

Within the nanocache, i.e. the stored states, bit interleaving can be performed. That is to say that bytes, half-words or words need not necessarily be stored in ascending order alongside one another (i.e. by adjacent bit lines).

In accordance with one embodiment, a stored state can be read out by access which requires only one clock cycle. The nanocache can thus match the speed of the memory accesses to the speed of the processor. During the first access to the memory (if the nanocache is not yet filled), delays can occur in a manner corresponding to an uncached excess to the memory.

By way of example, for each RAM basic block, the address of the memory cell (or address of the word line) of the basic block which was accessed last is stored and, in the event of a new access, is compared with the address of the new access (i.e. the memory cell/word line addressed by the new access), for example by an address detecting logic. In the case of a hit in the nanocache, i.e. correspondence of the two addresses, the nanocache outputs the addressed datum in the case of a read access. In the case of a write access, the value which is to be written is transferred both into the addressed memory cell and into the bit line latch which stores the state for the basic block.

As a result, it is possible to reduce the energy consumption in the case of a plurality of successive RAM accesses, assuming that the locality is within a word line width, for example 128 bits. If this is the case, then no further precharge is required. By way of example, by a multiplexer provided for each bit line, the stored data are output in the granularity used (for example a byte, a half-word or a word). The longer the word line, for example 256 bits instead of 128 bits, the greater the energy saving that can be achieved.

Figure 4:
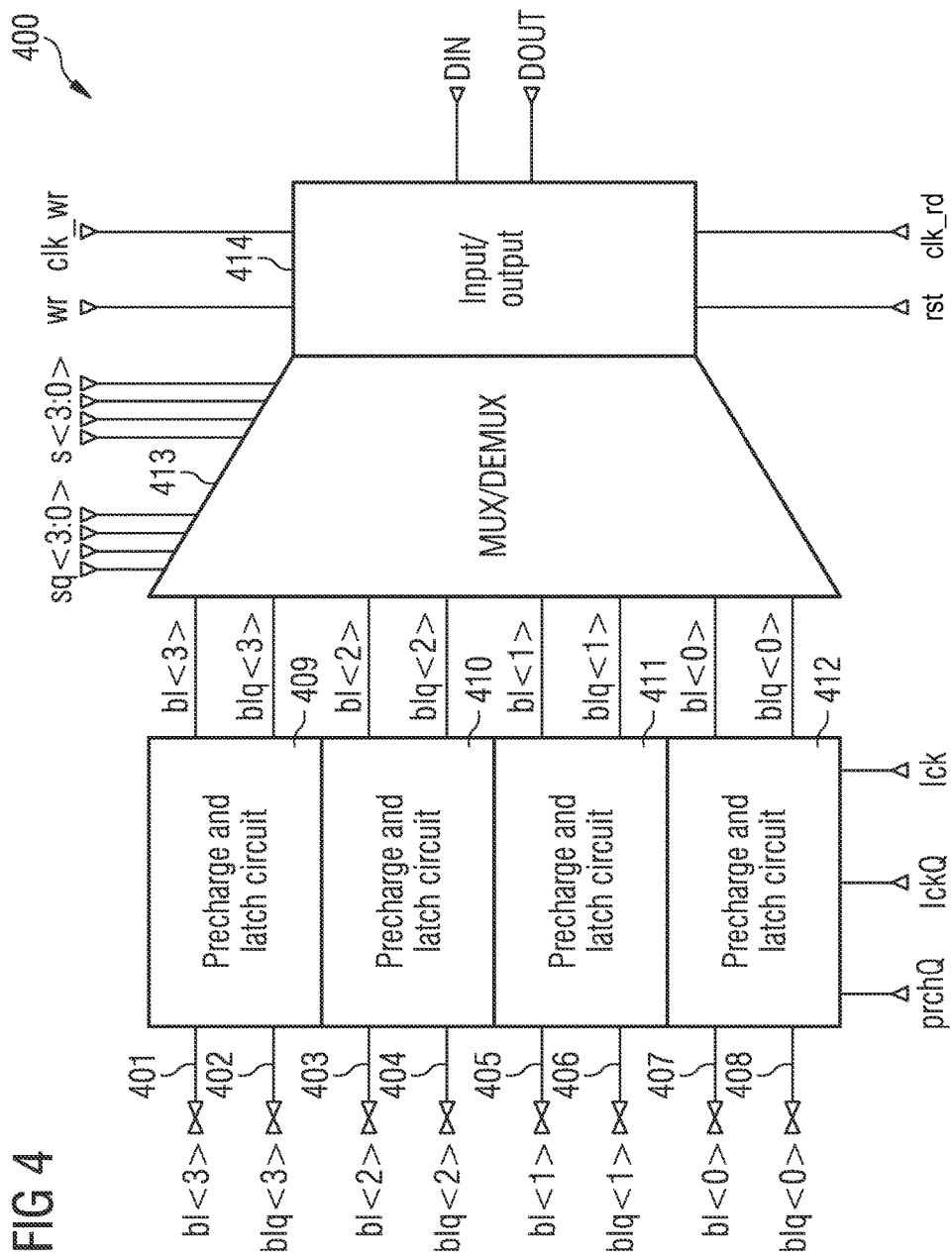
FIG. 4 shows a memory access circuit in accordance with one embodiment in greater detail.

FIG. 4 shows a memory access circuit 400 in accordance with one embodiment.

In this example, the memory access circuit serves for a partial array of an SRAM memory cell array including four pairs composed of bit line 401, 403, 405, 407 and respectively associated inverted bit line 402, 404, 406, 408. Each pair composed of bit line 401, 403, 405, 407 and inverted bit line 402, 404, 406, 408 is connected to a multiplicity of SRAM memory cells as described with reference to FIG. 1, wherein during an access one SRAM memory cell of the multiplicity of SRAM memory cells (according to the RAM basic block size) is activated by the associated word line.

In other words, the memory access circuit 400 illustrated serves for accessing four rows of the memory cell array. In the case of a word line width of 128 bits (i.e. one word line serves for addressing 128 memory cells), the memory access circuit illustrated is correspondingly present 32 times, for example.

Each pair composed of bit line and associated inverted bit line is connected to a multiplex/demultiplex circuit 413 by a respective precharge and latch circuit 409 to 412, which precharges the bit line pair if necessary and buffer stores the states of the bit lines, the input of which multiplex/demultiplex circuit (if it operates as a demultiplexer) or the output of which multiplex/demultiplex circuit (if it operates as a multiplexer) is connected to an input/output circuit 414.

The bit lines 401 to 408 are for example the bit lines which are connected to the memory cells which respectively store a first bit (e.g. bit 0) of four 32-bit words. The bits of an individual word are therefore not accessed by adjacent bit lines, rather the bits of the four words are grouped in accordance with their bit position in the words. This can be regarded as interleaving and enables a small area requirement of the multiplex/demultiplex circuit 413.

In the event of a write access, the input/output circuit 414 receives an input signal (input bit) DIN. The multiplex/demultiplex circuit 413, which operates as a demultiplexer in this case, forwards the input signal to the bit line pair whose assigned selection signal of the selection signals s<3:0> and whose assigned inverted selection signal of the inverted selection signals sq<3:0> are active.

In the event of a read access, the multiplex/demultiplex circuit 413, which operates as a multiplexer in this case, forwards the state of the bit line pair whose assigned selection signal of the selection signals s<3:0> and whose assigned inverted selection signal of the inverted selection signals sq<3:0> are active to the input/output circuit 414, which outputs the state as output signal (output bit) DOUT.

Figure 5:
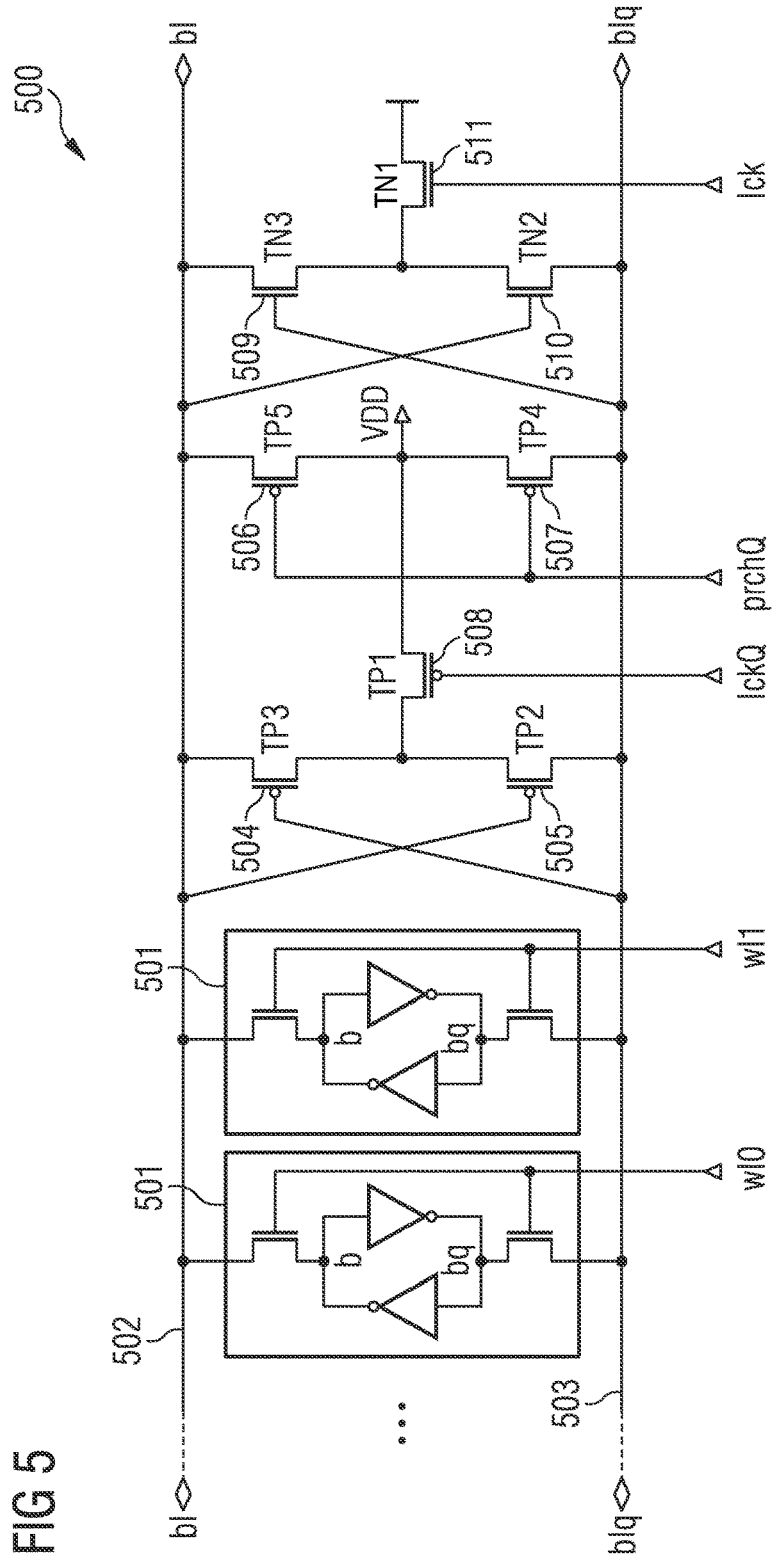
FIG. 5 shows a nanocache arrangement in accordance with one embodiment.

The precharge and latch circuits 409 to 412 and the signals prchQ, lckQ, lck received by them are illustrated in greater detail in FIG. 5.

FIG. 5 shows a nanocache arrangement 500 in accordance with one embodiment.

The nanocache arrangement 500 corresponds for example to one of the precharge and latch circuits 409 to 412 together with the SRAM cells coupled to the precharge and latch circuit 409 to 412.

The nanocache arrangement 500 includes a multiplicity of SRAM cells 501 which are coupled to a bit line 502 and an inverted bit line 503 as described with reference to FIG. 1. The number of SRAM cells 501 corresponds for example to the size of a RAM basic block.

A first p-channel FET 504 and a second p-channel FET 505 are connected in series between the bit line 502 and the inverted bit line 503.

The gate of the first p-channel FET 504 is connected to the inverted bit line 503 and the gate of the second p-channel FET 505 is connected to the bit line 502.

Furthermore, a third p-channel FET 506 and a fourth p-channel FET 507 are connected in series between the bit line 502 and the inverted bit line 503.

A fifth p-channel FET 508 is connected between the connecting node of the first p-channel FET 504 and of the second p-channel FET 505 and a high supply potential (VDD). The connecting node of the third p-channel FET 506 and of the fourth p-channel FET 507 is coupled to the high supply potential.

The gate of the third p-channel FET 506 and the gate of the fourth p-channel FET 507 acquire the active low precharge signal prchQ, by which the bit lines 503, 504 can be charged to the high supply potential.

Furthermore, a first n-channel FET 509 and a second n-channel FET 510 are connected in series between the bit line 502 and the inverted bit line 503.

A third n-channel FET 511 is connected between the connecting node of the first n-channel FET 509 and of the second n-channel FET 510 and a low supply potential (VSS).

The active high latch activation signal lck is fed to the gate of the third re-channel FET 511 and the inverse active low latch activation signal lckQ relative thereto is fed to the gate of the fifth p-channel FET 508.

If the latch activation signals are active, then the first p-channel FET 504, the second p-channel FET 505, the first n-channel FET 509 and the second n-channel FET 510 function as a latch which holds the states of the bit lines 502, 503.

Figure 6:
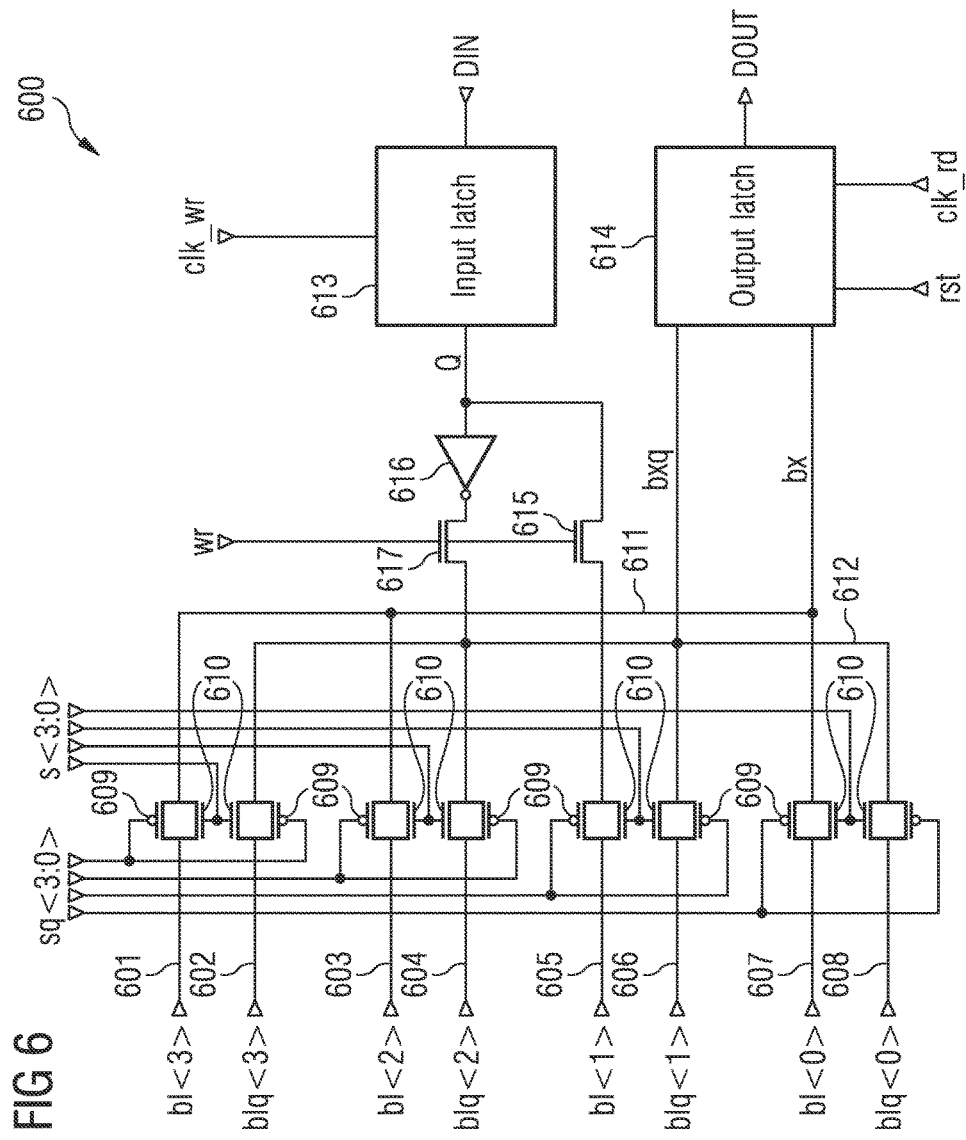
FIG. 6 shows a multiplex/demultiplex arrangement in accordance with one embodiment.

One example of the multiplex/demultiplex circuit 413 and the input/output circuit 414 is illustrated in FIG. 6.

FIG. 6 shows a multiplex/demultiplex arrangement 600.

The multiplex/demultiplex arrangement 600 includes a transmission gate composed of in each case a p-channel FET 609 and an n-channel FET 610 for each bit line 601, 603, 605, 607 and for each inverted bit line 602, 604, 606, 608.

The transmission gate of a bit line is connected between the bit line and a (non-inverted) first input/output node 611 and the transmission gate of an inverted bit line is connected between the bit line and an inverted second input/output node 612.

The gate of the p-channel FET 609 for a bit line 601, 603, 605, 607 is fed the inverted selection signal of the inverted selection signals sq<3:0> which is assigned to said bit line.

The gate of the p-channel FET 609 for an inverted bit line 602, 604, 606, 608 is fed the inverted selection signal of the inverted selection signals sq<3:0> which is assigned to said bit line.

The gate of the n-channel FET 610 for a bit line 601, 603, 605, 607 is fed the selection signal of the selection signals s<3:0> which is assigned to said bit line.

The gate of the n-channel FET 610 for an inverted bit line 602, 604, 606, 608 is fed the selection signal of the selection signals s<3:0> which is assigned to said bit line.

A bit line and an inverted bit line which belong to a bit line pair are assigned the same selection signal of the selection signals s<3:0> and the same inverted selection signal of the inverted selection signals sq<3:0>.

The FETs 609, 610 form a bidirectional multiplex/demultiplex circuit which operates as a 4-to-1 bit line multiplexer in the case of a read access and operates as a 1-of-4 demultiplexer in the case of a write access.

The multiplex/demultiplex arrangement 600 furthermore includes a data input latch 613 and a data output latch 614, which correspond to the input/output circuit 414.

During a write access, for each clock cycle of a write clock cycle clk_wr, the data input latch 613 receives an input signal DIN, buffers it and outputs it as signal Q at its output.

A first further n-channel FET 615 is connected between the output of the data input latch 613 and the first input/output node 611.

Furthermore, the output of the data input latch 613 is connected to the input of an inverter 616. A second further n-channel FET 617 is connected between the output of the inverter 616 and the second input/output node 612.

The gates of the further n-channel FETs 615, 617 are fed the active high write activation signal wr, such that, during a write access, the further n-channel FETs 615, 617 forward the input signal and the inverted input signal to the first input/output node 611 and the second input/output node 612, respectively.

The first input/output node 611 is connected to a non-inverting input of the data output latch 614 and the second input/output node 612 is connected to an inverting input of the data output latch 614.

During a read access, for each clock cycle of a read clock clk_rd, the data output latch 614 receives the states of the input/output nodes 611, 612, buffers them and outputs a corresponding output signal DOUT (for example the buffered state of the first input/output node 611).

The data output latch 614 can be reset by a reset signal rst.

Figure 7:
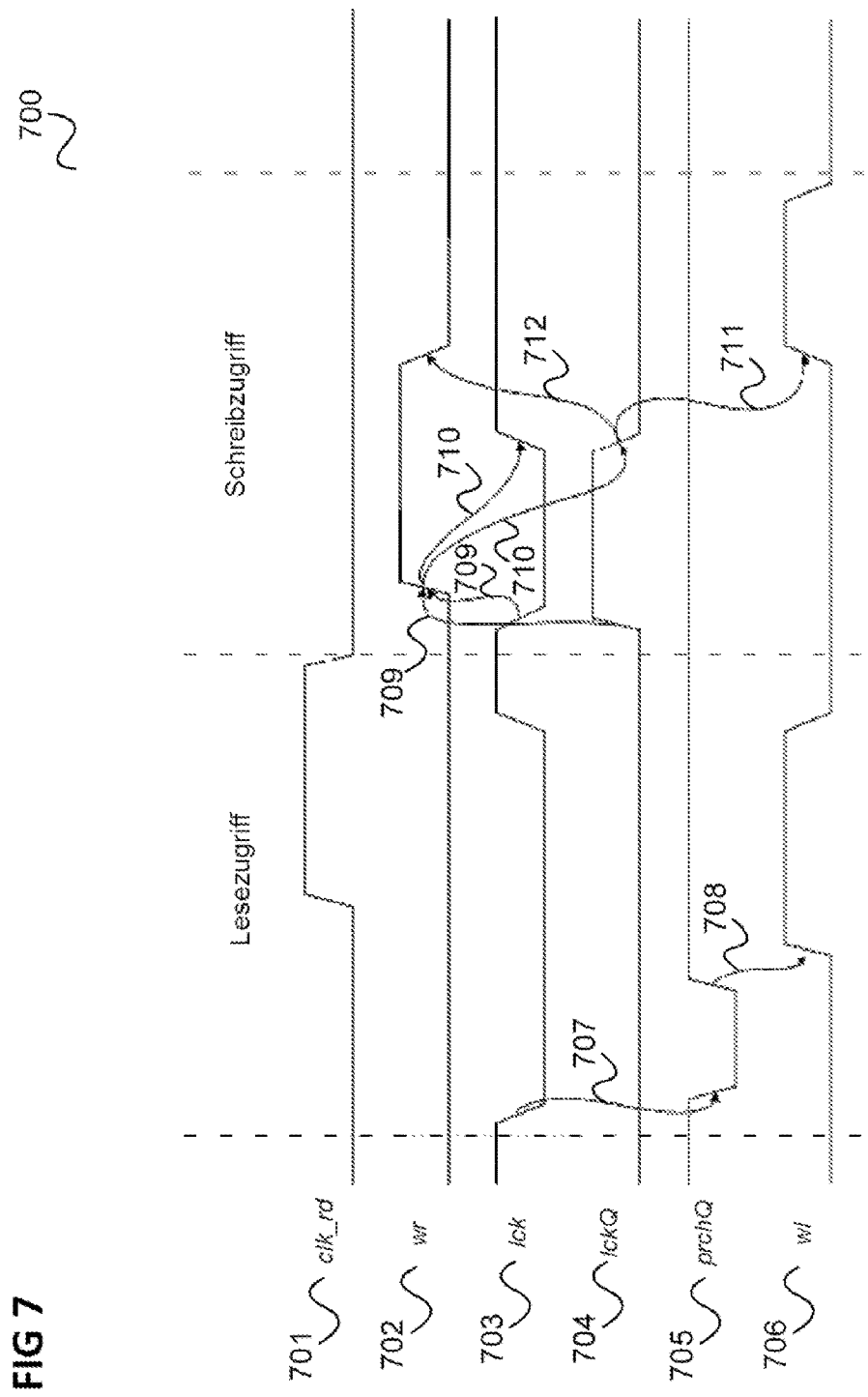
FIG. 7 shows one example of the profile of various signals for an access without a nanocache hit.

FIG. 7 shows one example of the profile of the signals clk_rd, wr, lck, lckQ, prchQ and wl for an access without a cache hit.

A first signal diagram 701 shows the profile of the signal clk_rd.

A second signal diagram 702 shows the profile of the signal wr.

A third signal diagram 703 shows the profile of the signal lck.

A fourth signal diagram 704 shows the profile of the signal lckQ.

A fifth signal diagram 705 shows the profile of the signal prchQ.

A sixth signal diagram 706 shows the profile of the signal wl.

For a read access, firstly the (bit line) latch activation signal lck for the re-channel FETs 509, 510, 511 is deactivated in order to avoid a driver conflict with the precharge (pull-up) transistors 506, 507, which are subsequently (arrow 707) activated, such that the bit line pair is charged to the logic state (1,1). This is necessary since after the preceding memory access the bit lines are held in their preceding (complementary) states.

After the precharge has ended, the selected word line wl (i.e. the word line which corresponds to a read address fed to the memory) is activated (arrow 708) and the bit lines assume complementary states according to the content of the addressed SRAM cell, such that the data output latch 614 can be activated by the activation of clk_rd. Finally, wl and clk_rd are deactivated and lck is activated again, such that the state of the bit lines is held.

For a write access, firstly the (bit line) latch activation signal lck for the re-channel FETs 509, 510, 511 and the (bit line) latch activation signal lckQ for the p-channel FETs 504, 505, 508 are deactivated in order to avoid a driver conflict with the input bit supplied by the data input latch 613. The write activation signal wr is subsequently activated (arrows 709). Afterward (arrows 710), the latch activation signals lck and lckQ are activated again, such that the written states of the bit line are brought to a full VDD-VSS difference and are held, such that the write activation signal wr can be deactivated again (arrow 711) and the selected word line wl (i.e. the word line which corresponds to a read address fed to the memory) can be activated (arrow 712), such that the states of the bit lines are transferred into the addressed SRAM cell. Finally, the word line is deactivated again, i.e. the access transistors 105, 107 of the selected SRAM cell are switched off. The bit written by the write access is held on the bit lines.

The sequence illustrated in FIG. 7 elucidates the case where the word line address of the current access differs from the word line address of the previous access. A description is given below, with reference to FIG. 8, of an address detecting logic which is provided in accordance with one embodiment in order to detect whether the word line address of the current access corresponds to the word line address of the previous access and correspondingly controls the memory access circuit 400.

Figure 8:
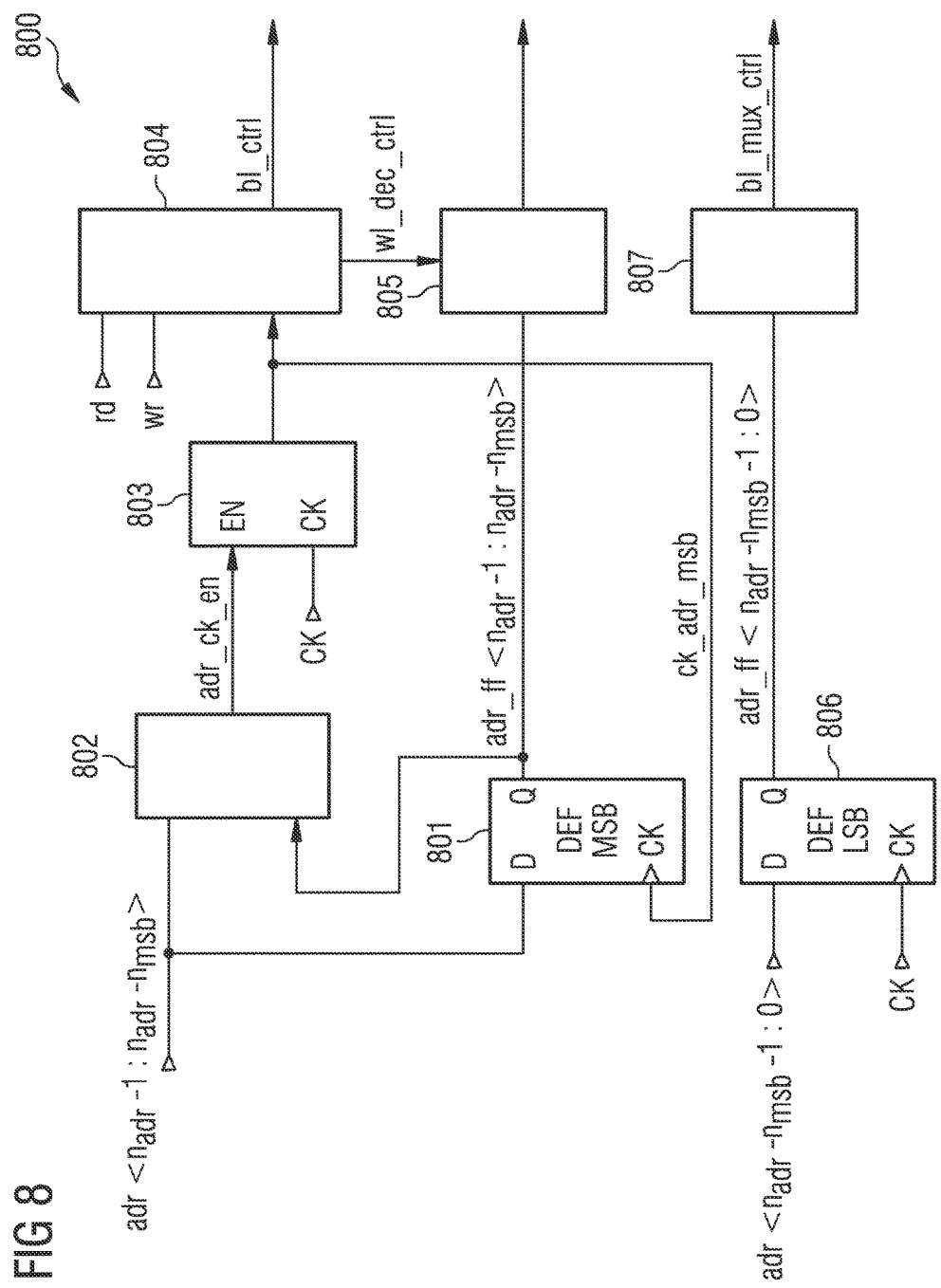
FIG. 8 shows an address detecting logic circuit.

FIG. 8 shows an address detecting logic circuit 800.

The address detecting logic circuit 800 receives an address word address for the current (i.e. most recent) access adr<$n_{adr}$-1:0>, the most significant bits adr<$n_{adr}$-1:$n_{adr}$-$n_{msb}$> of which indicate the address of the word line and the least significant bits adr<$n_{adr}$-nmsb-1:0> of which indicate the word of the words (for example of the four 32-bit words) which are accessed by the addressed word line.

The address detecting logic circuit 800 includes a first flip-flop circuit 801, which stores the $n_{msb}$ most significant bits of the previous address, i.e. the word line address for the previous access, adr_ff<$n_{adr}$-1:$n_{adr}$-$n_{msb}$>. By way of example, the first flip-flop circuit 801 includes for each of the $n_{msb}$ most significant bits of an address, a D-type flip-flop which, during an access, receives the bit of the address at its D input, stores it for the subsequent access and outputs it via its Q output.

The address detecting logic circuit 800 furthermore includes an address comparator 802, which receives the $n_{msb}$ most significant bits of the current address, i.e. of the word line address for the current access, adr<$n_{adr}$-1:$n_{adr}$-$n_{msb}$>, and compares them with the $n_{msb}$ most significant bits of the stored previous word line address fed to it by the first flip-flop circuit 801.

By way of example, the address comparator 802 generates an output signal adr_ck_en in accordance with $$\text{adr\_ck\_en} = \sum_{j=n_{adr}-n_{msb}}^{n_{adr}-1} (\text{adr}(j) \oplus \text{adr\_ff}(j))$$

where the summation sign Σ denotes a Boolean OR.

The output signal is fed to a clock gating circuit 803, which, depending on whether adr_ck_en is equal to 1 or 0, switches through or blocks the clock signal CK for the memory at its output.

The output signal of the clock gating circuit 804 is fed to the first flip-flop circuit 801 as clock (for example to each D-type flip-flop at its clock input).

Consequently, the first flip-flop circuit 801 stores the current word line address only if the current word line address differs from the previous word line address.

The output signal of the clock gating circuit is also fed to a word line/bit line control circuit 804, which generates a bit line control signal bl_ctrl and a word line decoder control signal wl_dec_ctrl. In this case, the word line/bit line control circuit 804 takes account of whether a read access (read activation signal rd active) or a write access (write activation signal wr active) is involved.

By way of example, the word line/bit line control circuit 804 generates the bit line control signal bl_ctrl in such a way that a precharge of the bit lines is carried out only if rd=1 and ck_adr_msb=1.

The word line decoder control signal wl_dec_ctrl controls a word line decoder 805.

The word line decoder 805 only ever activates one of its $2^n$ wordlines which are available to it. The stored word line address in 801 is the currently active word line address which is read from or written to.

The address comparison takes place between the (last) active word line address and the next (current) word line address.

The address detecting logic circuit 800 furthermore includes a second flip-flop circuit 806, which stores the least significant bits of the previous address, i.e. of the word line address for the previous access, adr_ff<$n_{adr}$-nmsb-1:0>. By way of example, the second flip-flop circuit 806 has, for each of the least significant bits of an address, a D-type flip-flop which, during an access, receives the bit of the address at its D input, stores it for the subsequent access and outputs it via its Q output.

The bits stored by the second flip-flop circuit 806 are fed to a bit line multiplexer control circuit 807, which correspondingly generates multiplexer control signals bl_mux_ctrl, such as the selection signals s and sq, for example.

Figure 9:
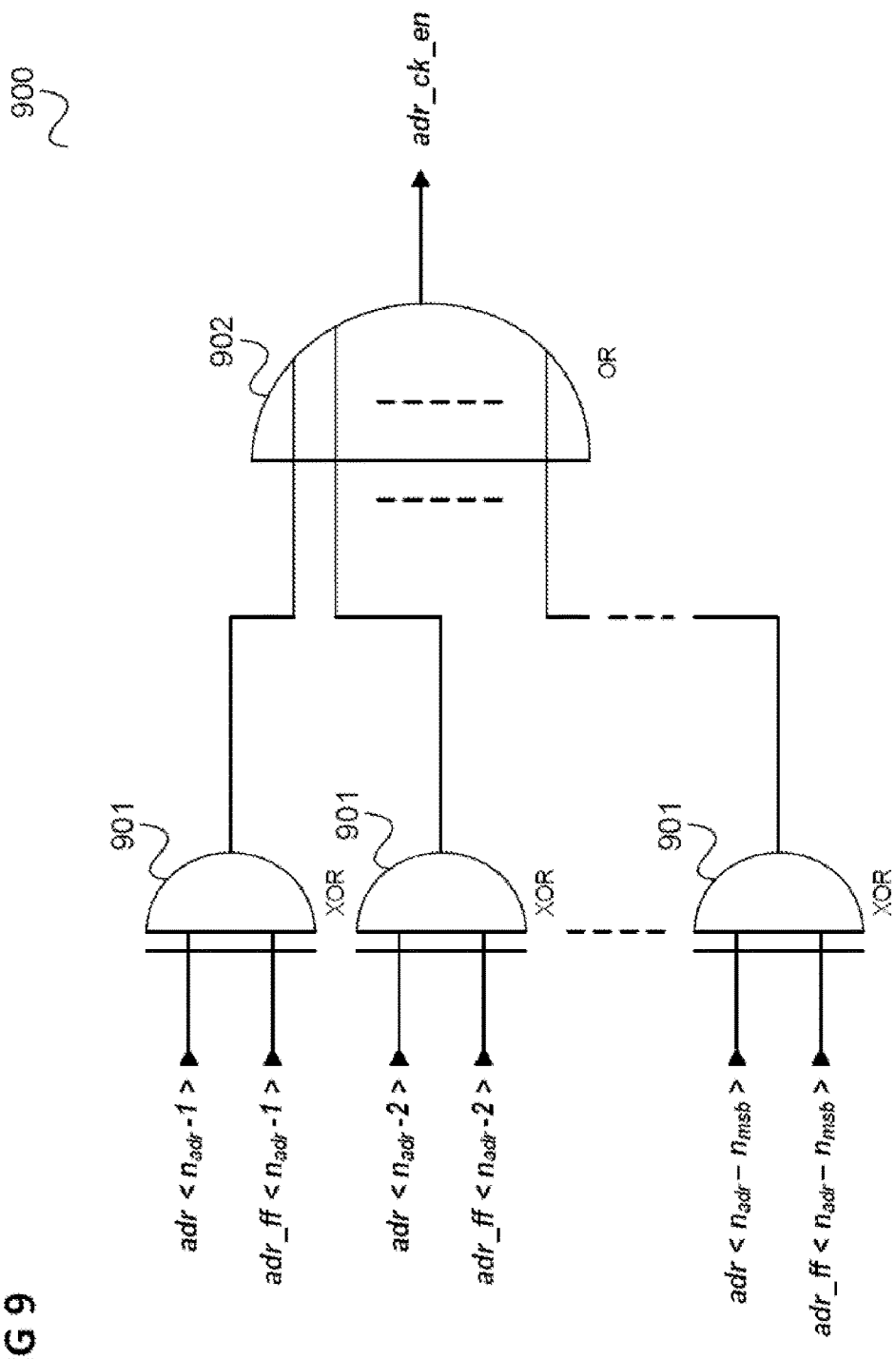
FIG. 9 shows an address comparison circuit.

One example of an implementation of the address comparator 802 is illustrated in FIG. 9.

FIG. 9 shows an address comparison circuit 900.

The address comparison circuit 900 includes a plurality of XOR gates 901, which in each case subject a bit of the current address to XORing with the corresponding bit of the previous address. The results of the XORings are ORed by an OR gate 902. The result of the ORing is the output signal of the address comparison circuit 900 adr_ck_en.

If the comparison carried out by the address comparison circuit 900 is successful, i.e. a nanocache hit is present, the current address is not stored in the first flip-flop circuit 801 since this address is already stored there. Moreover, the bit line multiplexer control circuit 807 typically selects a different word (of the for example four words having the same word line address) since the processor typically does not want to read the same datum again, but rather for example the word having the next higher address. That is determined by the less significant address bits stored in the second flip-flop circuit 806. New selection signals s and sq are correspondingly fed to the multiplex/demultiplex circuit 413.

In contrast to the sequence illustrated in FIG. 7, prchQ is not low-activated in the case of a nanocache hit during a read access, in order to save power and to read faster. If the read access in FIG. 7 takes up a time of two clock cycles, for example, the duration can thereby be reduced to one clock cycle in the case of a nanocache hit. In an embodiment in which the output latch 614 is not present, rather the states of the nodes 611, 612 are output directly, the activation of clk_rd can also be dispensed with.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for accessing a memory, the method comprising:
   carrying out a first access to the memory and charging, for a memory cell, a bit line coupled to the memory cell to a value which is stored or to be stored in the memory cell;
   storing the state of the bit line on the bit line itself by a circuit realizing a bit-line latch until a second access, which follows the first access; wherein the bit line is a latch node of a bit line latch; wherein the bit-line latch is coupled to the memory cell; and
   outputting the held state if the second access is a read access to the memory cell.

2. The method of claim 1,
   wherein the first access is reading a value from the memory cell or an additional memory cell coupled to the bit line.

3. The method of claim 1,
   wherein the first access is writing a value to the memory cell or an additional memory cell coupled to the bit line.

4. The method of claim 1, further comprising:
   if the second access is a write access to the memory cell, charging the bit line to a value which is to be written during the write access.

5. The method of claim 1, further comprising:
   if the second access is a read access to a different memory cell coupled to the bit line, precharging the bit line.

6. The method of claim 1, further comprising:
   charging, for each further memory cell of a plurality of further memory cells coupled to the same bit line as the memory cell, a further bit line coupled to the further memory cell to a value which is stored or to be stored in the further memory cell;
   storing the states of the further bit lines until the second access; and
   selecting the held state of the memory cell accessed by the second access from the held states and outputting the selected state if the second access is a read access to the memory cell or one of the further memory cells.

7. The method of claim 6,
   wherein selecting and outputting the selected state comprises multiplexing the held states in accordance with the memory cell accessed by the second access.

8. The method of claim 1,
wherein the memory cell is an SRAM cell.

9. The method of claim 1, further comprising:
checking whether the second access is a read access to the memory cell.

10. The method of claim 1, further comprising:
checking whether the second access is an access to the memory cell or an additional memory cell coupled to the bit line.

11. The method of claim 10,
wherein checking whether the second access is an access to the memory cell or an additional memory cell coupled to the bit line comprises comparing a word line address of the first access with a word line address of the second access.

12. A memory access circuit, comprising:
a bit line control circuit designed, in the event of a first access to a memory being carried out for a memory cell of the memory, to charge a bit line coupled to the memory cell to a value which is stored or to be stored in the memory cell;

a storing circuit designed to store a state of the bit line on the bit line itself by a circuit realizing a bit-line latch until a second access, which follows the first access;

where the bit line is a latch node of a bit line latch; wherein the bit-line latch is coupled to the memory cell; and an output circuit designed to output the held state if the second access is a read access to the memory cell.

13. The memory access circuit of claim 12,
wherein the memory cell is an SRAM cell.

14. The method of claim 1, wherein the bit-line latch is adjacent to the memory cell.

15. The method of claim 1, wherein the bit-line latch is exterior to the memory cell.

16. The method of claim 1, wherein buffer storage occurs at the bit line level.

* * * * *